(12) United States Patent
Odnoblyudov

(10) Patent No.: US 11,502,066 B2
(45) Date of Patent: Nov. 15, 2022

(54) RED FLIP CHIP LIGHT EMITTING DIODE, PACKAGE, AND METHOD OF MAKING THE SAME

(71) Applicant: Bridgelux, Inc., Livermore, CA (US)

(72) Inventor: Vladimir A. Odnoblyudov, Danville, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 16/667,540

(22) Filed: Oct. 29, 2019

(65) Prior Publication Data

US 2020/0168586 A1 May 28, 2020

Related U.S. Application Data

(60) Continuation of application No. 15/986,748, filed on May 22, 2018, now Pat. No. 10,461,064, which is a
(Continued)

(51) Int. Cl.
*H01L 33/00* (2010.01)
*H01L 25/075* (2006.01)
(Continued)

(52) U.S. Cl.
CPC ........ *H01L 25/0753* (2013.01); *H01L 33/501* (2013.01); *H01L 33/502* (2013.01);
(Continued)

(58) Field of Classification Search
CPC . H01L 25/0753; H01L 33/501; H01L 33/502; H01L 33/504; H01L 33/508; H01L 33/52; H01L 33/56
(Continued)

(56) References Cited

U.S. PATENT DOCUMENTS 8,368,100 B2 * 2/2013 Donofrio ................ H01L 33/62
257/98
8,395,312 B2 * 3/2013 Hum .................... H01L 25/0753
313/501
(Continued)

OTHER PUBLICATIONS

Restriction Requirement dated Jun. 22, 2016 in corresponding U.S. Appl. No. 14/752,803, filed Jun. 26, 2015 total 6 pages.
(Continued)

*Primary Examiner* — Tan N Tran
(74) *Attorney, Agent, or Firm* — Snell & Wilmer L.L.P.

(57) ABSTRACT

Flip chip LEDs comprise a transparent carrier and an active material layer such as AlInGaP bonded to the carrier and that emits light between about 550 to 650 nm. The flip chip LED has a first electrical terminal in contact with a first region of the active material layer, and a second electrical terminal in contact with a second region of the active material layer, wherein the first and second electrical terminals are positioned along a common surface of the active material layer. Chip-on-board LED packages comprise a plurality of the flip chip LEDs with respective first and second electrical terminals interconnected with one another. The package may include Flip chip LEDs that emit light between 420 to 500 nm, and the flip chip LEDs are covered with a phosphorus material comprising a yellow constituent, and may comprise a transparent material disposed over the phosphorus material.

20 Claims, 4 Drawing Sheets

Related U.S. Application Data division of application No. 14/752,803, filed on Jun. 26, 2015, now Pat. No. 9,978,724.

(60) Provisional application No. 62/018,511, filed on Jun. 27, 2014.

(51) Int. Cl.
*H01L 33/50* (2010.01)
*H01L 33/52* (2010.01)
*H01L 33/56* (2010.01)

(52) U.S. Cl.
CPC .......... *H01L 33/504* (2013.01); *H01L 33/508* (2013.01); *H01L 33/52* (2013.01); *H01L 33/56* (2013.01); *H01L 33/0093* (2020.05); *H01L 33/50* (2013.01); *H01L 2224/16225* (2013.01); *H01L 2924/181* (2013.01)

(58) Field of Classification Search
USPC ..................................................... 257/89, 98
See application file for complete search history.

(56) References Cited

U.S. PATENT DOCUMENTS

| | | | |
|---|---|---|---|
| 10,892,386 B2* | 1/2021 | Seo .......................... | H01L 33/62 |
| 2009/0179207 A1 | 7/2009 | Chitnis et al. | |
| 2011/0058369 A1 | 3/2011 | Imamura et al. | |
| 2011/0198991 A1 | 8/2011 | Jeong et al. | |
| 2012/0034718 A1* | 2/2012 | Khan ...................... | H01L 33/06 438/27 |
| 2013/0170174 A1 | 7/2013 | Chou et al. | |
| 2014/0231849 A1* | 8/2014 | Song ...................... | H01L 33/405 257/98 |
| 2014/0319567 A1* | 10/2014 | Yoneda ................... | H01L 33/40 257/98 |

OTHER PUBLICATIONS

Non-Final Office Action dated Dec. 1, 2016 in corresponding U.S. Appl. No. 14/752,803, filed Jun. 26, 2015; total 15 pages.

Final Office Action dated Aug. 11, 2017 in corresponding U.S. Appl. No. 14/752,803, filed Jun. 26, 2015; total 17 pages.

Advisory Action dated Oct. 27, 2017 in corresponding U.S. Appl. No. 14/752,803, filed Jun. 26, 2015; total 2 pages.

Notice of Allowance dated Jan. 18, 2018 in corresponding U.S. Appl. No. 14/752,803, filed Jun. 26, 2015 total 9 pages.

Corrected Notice of Allowance dated Feb. 9, 2018 in corresponding U.S. Appl. No. 14/752,803, filed Jun. 26, 2015; total 5 pages.

Non-Final Office Action dated Feb. 25, 2019 in corresponding U.S. Appl. No. 15/986,748, filed May 22, 2018 total 26 pages.

Notice of Allowance dated Jun. 19, 2019 in corresponding U.S. Appl. No. 15/986,748, filed May 22, 2018; total 8 pages.

\* cited by examiner

RED FLIP CHIP LIGHT EMITTING DIODE, PACKAGE, AND METHOD OF MAKING THE SAME

CROSS-REFERENCE TO RELATED APPLICATIONS

This patent application is a continuation of U.S. patent application Ser. No. 15/986,748 filed May 22, 2018, now U.S. Pat. No. 10,461,064 issued Oct. 29, 2019, which is a division of U.S. patent application Ser. No. 14/752,803 filed Jun. 26, 2015, now U.S. Pat. No. 9,978,724 issued May 22, 2018, which claims the benefit of U.S. Provisional Patent Application No. 62/018,511 filed on Jun. 27, 2014, which applications are hereby incorporated by reference in their entirety.

FIELD

Disclosed herein is a red flip chip light emitting diode, light emitting diode packaging comprising the same, and methods for making the same.

BACKGROUND

Flip chip light emitting diodes (LEDs) and the use of the same in light emitting assemblies are known in the art. Such known flip chip LEDs are constructed making use of active materials known to produce light in a blue wavelength when subjected to a power source to initiate current flow through the flip chip, and are referred to as blue flip chip LEDs. Such blue flip chip LEDs are used to accommodate white LED applications. However, there also exists a need for multi-color applications that are not currently satisfied by use of the blue flip chip LEDs.

It is, therefore, desired that a LED be developed in a manner that addresses and meets the needs of such multi-color applications. It is further desired that such LED be constructed having an architecture that is the same as or similar to the architecture of other LEDs that may be used in an LED package to thereby simplify the assembly process and optical and thermal design.

SUMMARY

Flip chip LEDs as disclosed herein comprise a carrier formed from a material transparent to light having a wavelength of from about 550 to 650 nm, and an active material layer bonded to the carrier and emitting light having a wavelength of from about 550 to 650 nm. In an example, the active material comprises AlInGaP, and the carrier material is selected from the group consisting of sapphire, glass, quartz, AlN, GaP and combinations thereof. Flip chip LEDs as disclosed herein have a first electrical terminal in contact with a first region of the active material layer, and a second electrical terminal in contact with a second region of the active material layer. In an example, the first and second electrical terminals are positioned along a common surface of the active material layer to facilitate electrically connecting the light emitting diode with electrical contacts positioned along an opposed surface of a connection member. In an example, the first region is disposed a depth beneath the second region and the first electrical terminal is electrically isolated from the second region.

Chip-on-board LED packages as disclosed herein comprise a plurality of the flip chip LEDs as described above, wherein one of the first or second electrical terminals are interconnected with others of the first or second electrical terminals. The flip chip LEDs are covered with a phosphorus material comprising a yellow constituent. The chip-on-board package may further comprise a transparent material disposed over the phosphorus material.

Chip-on-board LED packages as disclosed herein may further comprise a plurality of flip chip LEDs comprising an active layer material emitting light having a wavelength in the range of from about 420 to 500 nm, where such flip chip LEDs are positioned adjacent the flip Chip LEDs disclosed above emitting light in a wavelength of from about 550 to 650 nm. In such embodiment, the different flip chip LEDs are each encapsulated by a phosphor material comprising a yellow constituent. For example, the phosphor material disposed over the first flip chip LEDs may have a different composition of the yellow constituent than the phosphor material disposed over the second flip chip LEDs. In an example, the chip-on-board LED package comprising the different flip chip LEDs further comprise a light transparent material disposed over the phosphor material, wherein the light transparent material may comprise a silicone material. In such chip-on-board LED package, the different flip chip LEDs comprise a pair of electrical terminals disposed along a common surface of the respective different flip chip LEDs.

Flip chip LEDs as disclosed herein may be made by the method of growing a layer of active material that emits light having a wavelength of from about 550 to 650 nm, wherein the layer of active material is grown onto a substrate having a crystalline lattice matching the crystalline lattice of the layer of active material. In an example, the active material may be AlInGaP, and the substrate may comprise GaAs. A carrier is attached to a surface of the active material layer that is opposite the substrate, wherein the carrier is formed from a material transparent to light emitted from the active material layer, and the carrier is bonded to the active material layer so as to provide a transparent interface therebetween. In an example, the carrier is selected from the group consisting of sapphire, glass, quartz, AlN, GaP and combinations thereof. The substrate is removed from the active material layer, and a pair of electrodes is formed on the light emitting diode along a common surface of the active material layer for connecting with electrical contacts of an adjacent connection member positioned opposite the common surface. In an example, a first electrode is installed to extend from a surface of the active material layer to first region disposed a partial depth below the active material layer surface, and a second electrode is installed along the active material layer surface. A portion of the active material layer is removed to expose the first region prior to installing the first electrode. The first and second electrodes are electrically isolated from one another. In an example, the first or second electrode has a contact surface area that is greater than that of the other of the first or second electrode.

BRIEF DESCRIPTION OF THE DRAWINGS

These and other features and advantages of light-emitting diodes, assemblies and methods for making the same as disclosed herein will be appreciated as the same becomes better understood by reference to the following detailed description when considered in connection with the accompanying drawings.

DETAILED DESCRIPTION

Light emitting diodes (LEDs) as disclosed herein are specially constructed having a flip chip architecture to emit light in yellow, amber and/or red wavelengths, and in an example in red wavelength of from about 550 to 650 nm. Such flip chips are referred to herein as red flip chip LEDs, and methods for making the same and packaging the same with other LEDs to provide an LED assembly/package capable of providing a multi-color output to meet the need of multi-color lighting applications are disclosed herein.

Figure 1:
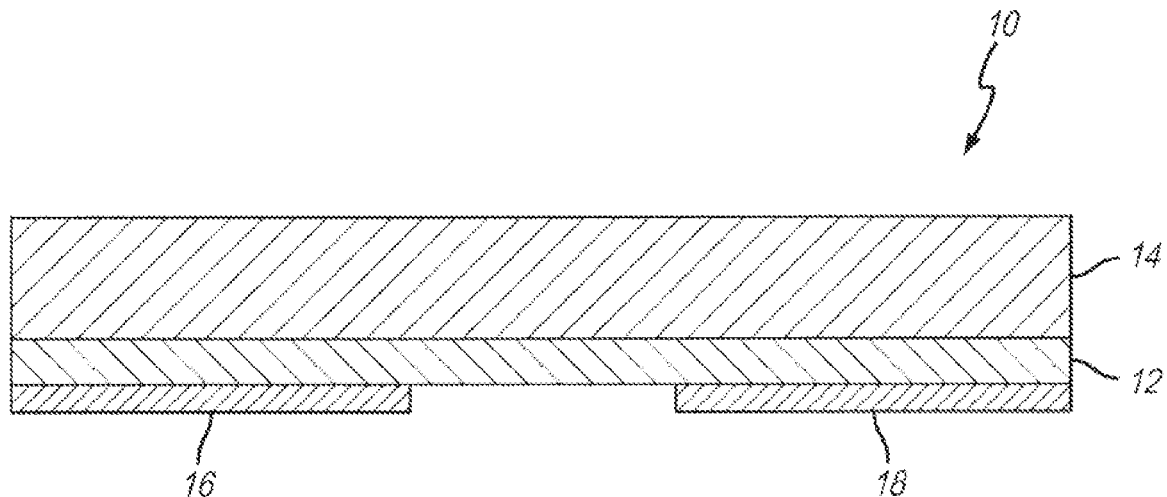
FIG. 1 illustrates a flip chip constructed to emit light in a blue wavelength.

FIG. 1 illustrates a flip chip LED 10 constructed from materials enabling it to emit light in a blue wavelength in the range of from about 400 to 500 nm, herein referred to as a blue flip chip LED. In an example, the blue flip chip LED comprises an active material 12 formed for example from GaN that has been grown, e.g., epitaxially grown, onto a transparent substrate 14 such as one formed from sapphire or the like having a compatible crystalline lattice structure as GaN. The blue flip chip LED includes a pair of electrodes 16 and 18, e.g., P and N electrodes, disposed on one side of the LED 10, that extend to different regions of the GaN active material 12, and that facilitate electrical connection of the blue flip chip LED by connecting with respective electrical contacts opposite from and adjacent the blue flip chip LED, i.e., along one side of the blue flip chip LED.

Figure 2:
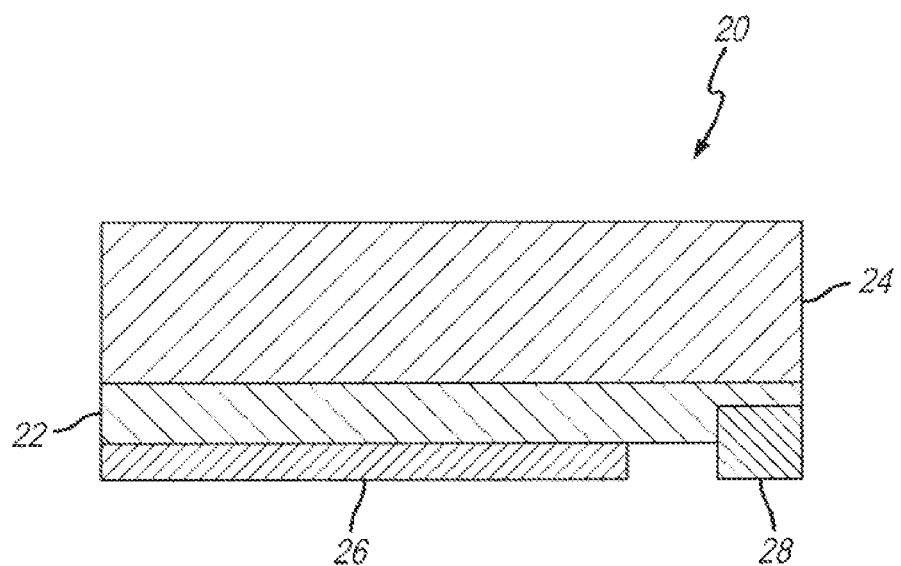
FIG. 2 is a cross-sectional side view of an example light emitting diode as disclosed herein constructed to emit light in a red wavelength.

FIG. 2 illustrates a flip chip LED 20 as disclosed herein construction from material enabling it to emit light in a red wavelength in the range of from about 550 to 650 nm, herein referred to as a red flip chip LED. Although it is to be understood that such flip chip LEDs as disclosed herein may also be constructed to emit light in the yellow and/or amber wavelengths. In an example, the red flip chip LED comprises an active layer 22 formed from a material capable of emitting such red wavelength light. In an example, the active material comprises AlInGaP. The active layer 22 is bonded or otherwise attached to a carrier 24 that is transparent to light emitted in such red wavelength. In an example, the carrier material can be selected from the group of materials including sapphire, glass, quartz, AlN, Gap and combinations thereof. In an example, the carrier is formed from sapphire. The red flip chip LED 20 includes a pair of electrodes 26 and 28, e.g., P and N electrodes, disposed on one side of the LED 20, that each extend to different regions of the AlInGaP active layer 22, and that facilitate electrical connection of the red flip chip LED by connecting with respective electrical contacts opposite from and adjacent the red flip chip LED, i.e., along one side of the red flip chip LED.

Figure 3A:
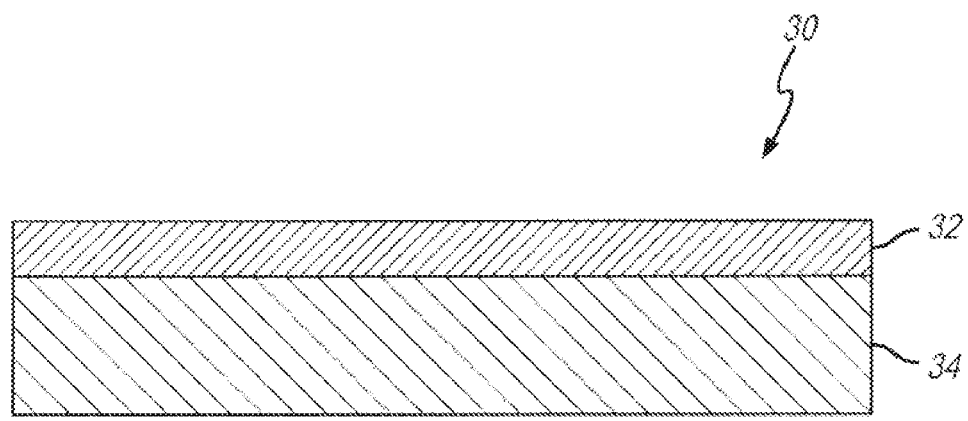
FIGS. 3a to 3e illustrates different steps in making the light emitting diode as disclosed herein.

FIGS. 3a to 3e illustrate different stages of forming an example red flip chip LED as disclosed herein. Referring to FIG. 3a, in an initial stage of making construction 30, a layer of the active material 32 such as AlInGaP is epitaxially grown by known technique on a substrate 34. The substrate is selected from the group of materials having a crystalline lattice matching the crystalline lattice of the active material. In an example, where the active material is AlInGaP, the substrate is formed from GaAs. A desired layer thickness of the active material is grown onto the substrate as called for by the particular application.

Figure 3B:
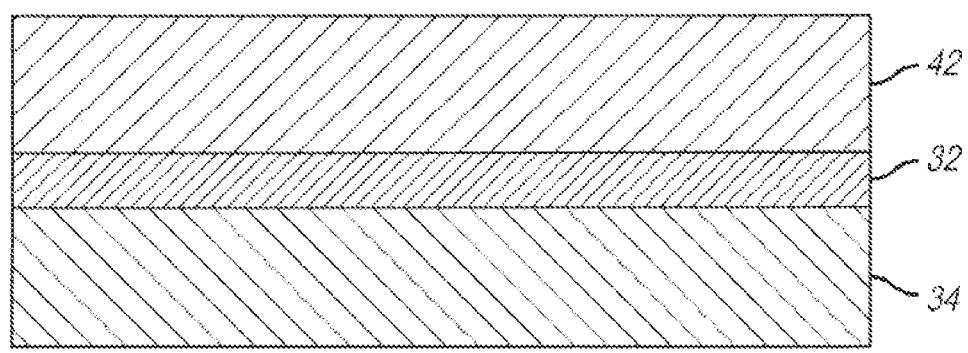

Referring to FIG. 3b, in another stage of making construction 40, a carrier 42 is attached to the exposed surface of the active material 32 opposite from the substrate 34. The carrier can be selected from the materials noted above that is transparent to light in the red wavelength. The carrier 42 is bonded to the active material surface by transparent adhesive bond, fusion bond, and the like so that the interface between the active material and the carrier is transparent to permit light emitted from the active layer to pass through interface and through the carrier 42. Alternatively, the carrier may be provided in the form of a thick content of silicone or other transparent resin material that is bonded to the active material layer. At this stage of the process, the construction 40 comprises the active material 32 interposed or sandwiched between the carrier 42 on one side and the substrate 34 on an opposite side.

Figure 3C:
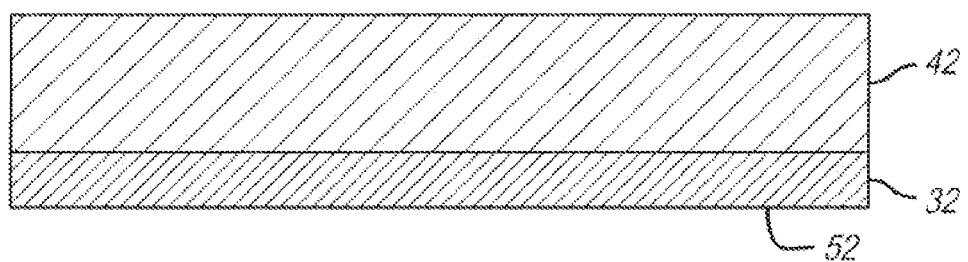

Referring to FIG. 3c, in another stage of making construction 50, the substrate (34 in FIG. 3b) is removed from the active material 32, thereby exposing a surface 52 of the active material 32. The substrate may be removed by etching process, by cutting process, and the like, or by other techniques and/or methods know in the art. The carrier 42 remains bonded to the active material.

Figure 3D:
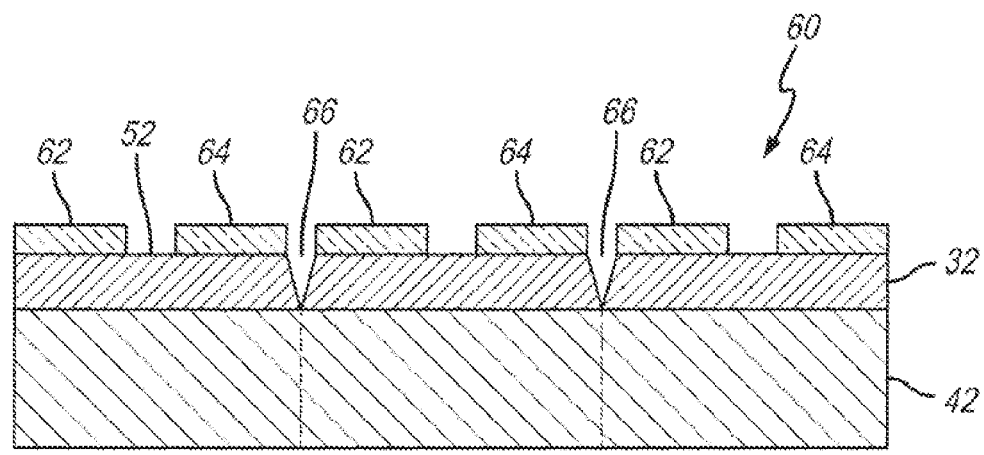
Figure 3E:
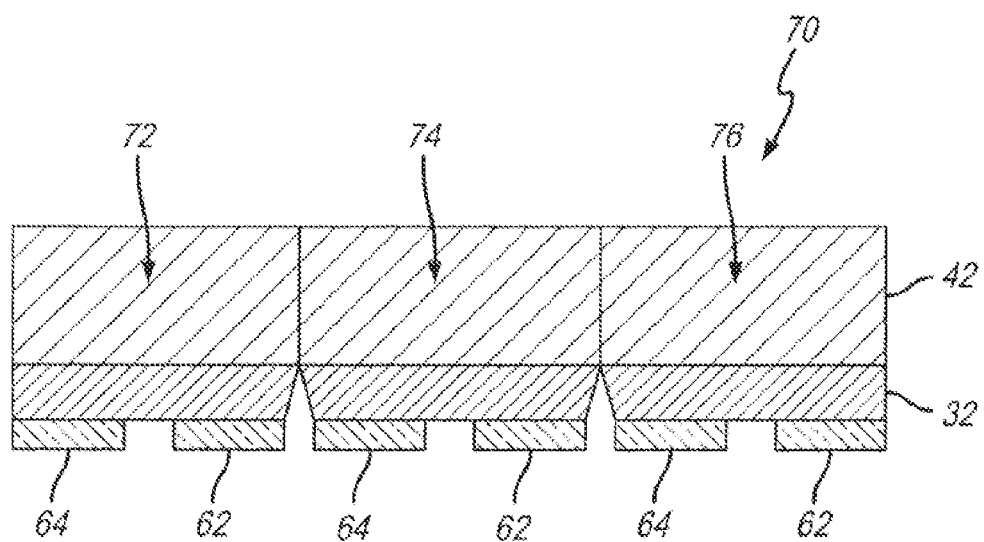

Referring to FIG. 3d, in another stage of making construction 60, after the substrate has been removed and the surface 52 of the active material 32 exposed, electrodes 62 and 64, e.g., P and N electrodes, are formed along different sections of the construction, and portions 66 of the active material are removed for subsequent dicing to form LED dies. The carrier 42 remains bonded to the active material. FIG. 3e illustrates a further stage of making the construction 70, wherein the construction has been flipped over with the electrodes 62 and 64 positioned along a bottom portion of the construction 70 and attached with the active material 32. At this stage of making, the construction 70 has been subjected to a dicing process for forming individual dies 72, 74, and 76 therefrom. The carrier 42 remains bonded to the active material in each of the so-formed dies.

Figure 4:
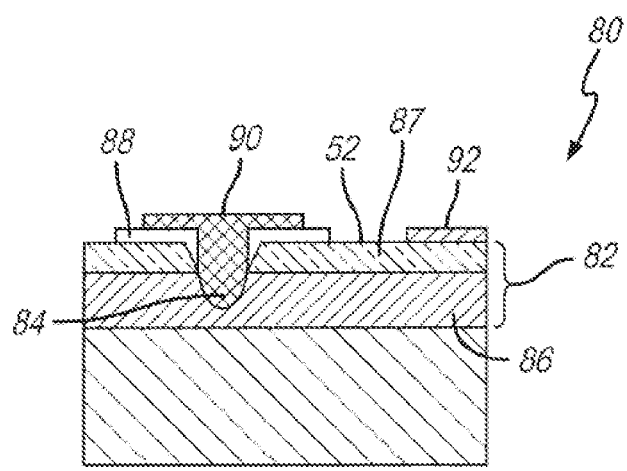
FIG. 4 is a cross-sectional illustration of an example light emitting diode as disclosed herein.

FIG. 4 illustrates a cross-sectional side view of a red flip chip LED 80 as disclosed herein. In an example, during the method step illustrated in FIG. 3d, the electrodes are formed using a buried contact process. As shown, a portion 84 of the active material 82 is removed a determined depth from the surface 52 to reach a first region 86 of the active material, e.g., a N region. An electrically insulating material 88 is disposed onto the surface 52 and into the depth of the active material to insulate a first electrode 90, e.g., an N electrode, from making contact with other regions of the active material. A second electrode 92, e.g., a P electrode, is formed on the surface 52 of the active material 82, e.g., a P region, and is electrically isolated from the first electrode and connects with a surface region 87 of the active material. If desired, the surface of one or both of the electrodes can be enlarged or increased or otherwise configured to facilitate accommodating a particular LED package/assembly. In an example, one of the electrodes, e.g., the P electrode, may be construed having surface area that is greater than the other electrode, e.g., that may occupy 95 percent or so of the electrical contact area for the LED. It is to be understood that the particular size and/or configuration of the electrodes can and will vary depending on the particular application and electrical connection member or substrate.

Figure 5:
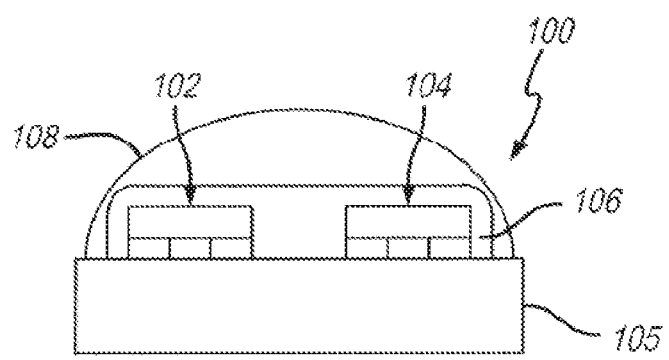
FIG. 5 is a schematic side view of an example light emitting assembly/package comprising a blue light emitting diode and a light emitting diode as disclosed herein.

FIG. 5 schematically illustrates a construction, package, or assembly 100 comprising a blue flip chip LED 102 that is positioned next to a red flip chip LED 104 as disclosed herein, wherein both flip chip LEDs are packaged together on a member 105. In this example, both the blue flip chip LED 102 and the red flip chip LED 104 are covered or encapsulated by a phosphor material 106 having a yellow constituent. In one example, the phosphor material covering the blue flip chip LED may have a different composition or amount of the yellow constituent, e.g., a greater amount, than the phosphor material covering the red flip chip LED. In such embodiment, the amount of the yellow constituent can be different to enable the assembly to emit light having a desired wavelength, e.g., an efficient warm while wavelength. In another embodiment, the phosphor material covering the blue flip chip LED and the red flip chip LED may have the same composition or amount of the yellow constituent. In such embodiment, where the phosphor material is the same, is may be desired that the concentration of the yellow constituent avoids or minimally overlaps light emitted from the red flip chip LED. The assembly 100 further comprises a transparent layer of material 108 that is disposed over the phosphor material. In an example, the transparent layer of material may comprise a silicone material.

Figure 6:
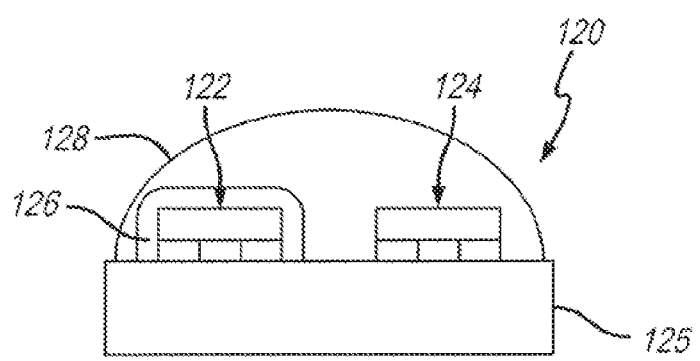
FIG. 6 is a schematic side view of an example light emitting assembly/package comprising a blue light emitting diode and a light emitting diode as disclosed herein.

FIG. 6 schematically illustrates a construction, package, or assembly 120 comprising a blue flip chip LED 122 that is positioned next to a red flip chip LED 124 as disclosed herein, wherein both flip chip LEDs are packaged together on a member 125. In this example, only the blue flip chip LED 122 is covered or encapsulated by a phosphor material 126 having a yellow constituent and the red flip chip LED 124 is not covered or encapsulated by the phosphor material. In such embodiment, the amount of the yellow constituent is provided to enable the assembly to emit light having a desired wavelength, e.g., an efficient warm while wavelength, without having to cover the red flip chip LED. The assembly 120 further comprises a transparent layer of material 128 that is disposed over the phosphor material covering the blue flip chip LED and over the red flip chip LED. In an example, the transparent layer of material may comprise a silicone material.

A feature of red flip chip LEDs, packaging, constructions and/or assemblies comprising the same, and methods of making as disclosed herein is that such enables use of flip chip architecture for introducing LEDs capable of emitting light in a red wavelength with other flip chip LEDs, e.g., blue flip chip LEDs, for the purpose of meeting needs of a variety of multi-color light applications, and efficiently being able to do so using LED assemblies already configured to accommodate such flip chip LED architecture, such as chip-on board LED packaging.

Although certain specific embodiments have been described and illustrated for purposes or reference, it is to be understood that the disclosure and illustrations as provided herein not limited to the specific embodiments. Accordingly, various modifications, adaptations, and combinations of various features of the described embodiments can be practiced without departing from the scope what has been disposed herein including in the following passages.

What is claimed is:
1. A flip chip light emitting diode comprising:
an active material layer bonded to a carrier along a first surface of the active material layer, wherein the active material layer emits a light having a particular wavelength range, and wherein the carrier is formed from a material transparent to light within the wavelength range emitted by the active material layer;
a first electrical terminal disposed along a second surface of the active material layer that is positioned opposite the active layer first surface, wherein the first electrical terminal is in contact with a first region of the active material layer that extends a partial depth into the active material layer from the second surface;
a second electrical terminal in contact with the second surface of the active material layer, wherein the second electrical terminal is in contact with a second region of the active material layer that is on the second surface; and
an insulating material disposed on the second surface and into a depth of the active material layer to electrically insulate the first electrical terminal from the second region of the active material layer, wherein the second electrical terminal does not contact any insulating material.

2. The flip chip light emitting diode as recited in claim 1, wherein the active material emits light within the wavelength of about 550 to 650 nm.

3. The flip chip light emitting diode as recited in claim 1, wherein the active material layer comprises AlInGaP.

4. The flip chip light emitting diode as recited in claim 1, wherein a portion of the active layer second surface between the first and second electrical terminals is exposed.

5. The flip chip light emitting diode as recited in claim 1, wherein the carrier is bonded to the active material layer by a transparent adhesive material, wherein the transparent adhesive material is interposed between and in direct contact with the carrier and the active material layer.

6. A chip-on-board package comprising two flip chip light emitting diodes as recited in claim 1, wherein a first flip chip light emitting diode comprises an active material that emits light having a first wavelength range and the second flip chip light emitting diode comprises an active material that emits light having a second wavelength range that is different from the first wavelength range.

7. The chip-on-board package as recited in claim 6, wherein one of the first or second wavelength ranges is about 550 to 650 nm.

8. The chip-on-board package as recited in claim 7, wherein the other of the first or second wavelength ranges is about 420 to 500 nm.

9. A chip-on-board package comprising two flip chip light emitting diodes as recited in claim 1, wherein one or both of the flip chip light emitting diodes are covered with a phosphorus material comprising a yellow constituent.

10. The chip-on-board package as recited in claim 9, wherein one or both of the flip chip light elements further comprise a transparent material disposed thereover.

11. A chip-on-board light emitting diode package comprising:
a first flip chip light emitting diode constructed to emit light in a first wavelength range; and
a second flip chip light emitting diode constructed to emit light in a second wavelength range that is different than the first wavelength range;
wherein one of the first or second flip chip light emitting diodes comprise an active material layer bonded to a transparent carrier, wherein the carrier is bonded to a first surface of the active material layer opposite a second surface of the active material layer, wherein the active material layer second surface comprises a first electrode and a second electrode disposed therein, wherein the first electrode extends a partial depth from the second surface and is in direct contact with a first region of the active material layer, wherein the second electrode is in direct contact with a second region of the active material layer that is at the active material layer second surface, and wherein an electrically insulating layer is interposed between the first electrode and the second region of the active material layer, and wherein the second electrode is not in contact with any electrically insulating layer disposed over the active layer second surface.

12. The chip-on-board light emitting diode package as recited in claim 11, wherein the second wavelength range is about 550 to 650 nm.

13. The chip-on board light emitting diode package as recited in claim 12, wherein the second flip chip light emitting diode comprises a phosphor material.

14. The chip-on-board light emitting diode package as recited in claim 11, wherein the carrier is selected from the group consisting of sapphire, glass, quartz, AlN, GaP and combinations thereof.

15. The chip-on-board light emitting diode package as recited in claim 11 further comprising a transparent material disposed over one or both of the first and second flip chip light emitting diodes.

16. The chip-on-board light emitting diode package as recited in claim 11, wherein a portion of the active layer second surface is exposed and not covered with the electrically insulating layer.

17. A flip chip light emitting diode comprising:
an active material emitting light in a particular wavelength range;
a carrier attached to a first surface of the active material and transparent to light in the particular wavelength range, wherein the carrier is not a growth substrate used to grow the active material, and wherein the flip chip light emitting diode active material is free of the growth substrate;
a first electrical terminal disposed on a second surface of the active material that is opposite the first surface of the active material, wherein the first electrical terminal is in direct contact with a first region of the active material located a partial depth from the second surface of the active material;
a second electrical terminal in direct contact with a second region of the active material located along the second surface of the active material; and
an insulating material disposed a portion of the second surface of the active material to electrically insulate the first electrical terminal from the second region of the active material, wherein a portion of the second surface of the active material is exposed and not covered with the insulating material.

18. The flip chip light emitting diode as recited in claim 17, wherein the first region is located at a depth in the active material different than the second region.

19. The flip chip light emitting diode as recited in claim 17, wherein the first and second electrical terminals are configured to electrically connect with electrical contacts positioned along an opposed surface of a connection member.

20. A chip-on-board package comprising two flip chip light emitting diodes as recited in claim 17, wherein a first flip chip light emitting diode comprises an active material that emits light having a first wavelength range and the second flip chip light emitting diode comprises an active material that emits light having a second wavelength range that is different from the first wavelength range.

* * * * *